(12) United States Patent
Spencer et al.

(10) Patent No.: US 9,873,315 B2
(45) Date of Patent: Jan. 23, 2018

(54) DUAL SIGNAL COAXIAL CAVITY RESONATOR PLASMA GENERATION

(71) Applicant: Plasma Igniter, LLC, Morgantown, OH (US)

(72) Inventors: Michael J. Spencer, Morgantown, WV (US); Andrew D. Lowery, Cumberland, MD (US); James E. Smith, Bruceton Mills, WV (US)

(73) Assignee: West Virginia University, Morgantown, WV (US)

( * ) Notice: Subject to any disclaimer, the term of this patent is extended or adjusted under 35 U.S.C. 154(b) by 125 days.

(21) Appl. No.: 14/680,734

(22) Filed: Apr. 7, 2015

(65) Prior Publication Data

US 2015/0287574 A1    Oct. 8, 2015
US 2017/0361694 A9    Dec. 21, 2017

Related U.S. Application Data

(63) Continuation-in-part of application No. 14/272,560, filed on May 8, 2014, now Pat. No. 9,638,157.

(60) Provisional application No. 61/976,843, filed on Apr. 8, 2014.

(51) Int. Cl.
| | |
|---|---|
| *F02P 23/04* | (2006.01) |
| *F02P 9/00* | (2006.01) |
| *H01T 13/50* | (2006.01) |
| *B60K 5/00* | (2006.01) |
| *H05H 1/46* | (2006.01) |
| *F02P 3/01* | (2006.01) |
| *F02P 15/10* | (2006.01) |
| *H01J 37/32* | (2006.01) |

(52) U.S. Cl.
CPC .................. *B60K 5/00* (2013.01); *F02P 3/01* (2013.01); *F02P 15/10* (2013.01); *H01T 13/50* (2013.01); *H05H 1/46* (2013.01); *F02P 9/007* (2013.01); *F02P 23/045* (2013.01); *H01J 37/32247* (2013.01); *H05H 2001/463* (2013.01)

(58) Field of Classification Search
CPC .......... F02P 9/007; F02P 23/045; H01T 13/50
USPC .................................................. 123/143 B
See application file for complete search history.

(56) References Cited

U.S. PATENT DOCUMENTS

| | | |
|---|---|---|
| 1,953,953 A | 4/1934 | Carr |
| 2,765,423 A | 10/1956 | Crapuchettes |
| 2,790,855 A | 4/1957 | Meisenheimer |

(Continued)

OTHER PUBLICATIONS

PCT Search Report and Written Opinion, PCT/US15/24727, dated Aug. 21, 2015.

(Continued)

*Primary Examiner* — Erick Solis
(74) *Attorney, Agent, or Firm* — Wayne M. Serra

(57) ABSTRACT

A plasma generator comprises a radio frequency power source, a coaxial cavity resonator assembly, and a direct current power source. The radio frequency power source provides a voltage supply of radio frequency power having a first ratio of power over voltage. The resonator assembly includes a center conductor coupled to the radio frequency power source, and also includes a virtual short circuit. The direct current power source is connected to the center conductor at the virtual short circuit, and provides a voltage supply of direct current power having a second ratio of power over voltage that is less than the first ratio.

55 Claims, 4 Drawing Sheets

(56) References Cited

U.S. PATENT DOCUMENTS

| | | | |
|---|---|---|---|
| 2,948,858 A | 8/1960 | Stameson |
| 3,473,879 A | 10/1969 | Berberich |
| 3,934,566 A | 1/1976 | Ward |
| 3,961,609 A | 6/1976 | Gerry |
| 4,064,961 A | 12/1977 | Tseo |
| 4,184,123 A | 1/1980 | Grill et al. |
| 4,292,610 A | 9/1981 | Makimoto et al. |
| 4,398,526 A | 8/1983 | Hamai et al. |
| 4,416,226 A | 11/1983 | Nishida et al. |
| 4,446,826 A | 5/1984 | Kimura et al. |
| 4,523,552 A | 6/1985 | Mukainakano et al. |
| 4,561,406 A | 12/1985 | Ward |
| 4,760,820 A | 8/1988 | Tozzi |
| 4,774,914 A | 10/1988 | Ward |
| 4,852,529 A | 8/1989 | Vowles |
| 5,076,223 A | 12/1991 | Harden et al. |
| 5,211,142 A | 5/1993 | Matthews et al. |
| 5,361,737 A | 11/1994 | Smith et al. |
| 5,549,795 A | 8/1996 | Gregoire et al. |
| 5,649,507 A | 7/1997 | Gregoire et al. |
| 5,655,210 A | 8/1997 | Gregoire et al. |
| 5,673,554 A | 10/1997 | DeFreitas et al. |
| 5,689,949 A | 11/1997 | DeFreitas et al. |
| 5,706,847 A | 1/1998 | Strait et al. |
| 5,734,353 A | 3/1998 | Van Voorhies |
| 5,845,480 A | 12/1998 | DeFritas et al. |
| 6,131,542 A | 10/2000 | Suckewer et al. |
| 6,321,733 B1 | 11/2001 | Suckewer et al. |
| 6,553,981 B1 | 4/2003 | Suckewer et al. |
| 6,745,744 B2 | 6/2004 | Suckewer et al. |
| 6,819,052 B2 | 11/2004 | Kitamura et al. |
| 6,883,507 B2 | 4/2005 | Freen |
| 6,913,006 B2 | 7/2005 | Schleupen et al. |
| 7,204,220 B2 | 4/2007 | Schmidt et al. |
| 7,328,677 B2 | 2/2008 | Hagiwara et al. |
| 7,467,612 B2 | 12/2008 | Suckewer et al. |
| 7,721,697 B2 | 5/2010 | Smith et al. |
| 7,963,262 B2 | 6/2011 | Heise |
| 8,226,901 B2 | 7/2012 | Makita et al. |
| 8,278,807 B2 | 10/2012 | Agneray et al. |
| 8,418,668 B2 | 4/2013 | Shimizu |
| 8,468,992 B2 | 6/2013 | Ruan et al. |
| 8,578,879 B2 | 11/2013 | Ramaswamy et al. |
| 8,641,916 B2 | 2/2014 | Yatsuda et al. |
| 8,746,218 B2 | 6/2014 | Freen |
| 8,861,173 B2 | 10/2014 | Ikeda et al. |
| 8,863,495 B2 | 10/2014 | Ikeda |
| 8,873,216 B2 | 10/2014 | Ikeda et al. |
| 8,879,062 B2 | 11/2014 | Ikeda |
| 8,890,410 B2 | 11/2014 | Ikeda et al. |
| 2004/0129241 A1 | 7/2004 | Freen |
| 2006/0048732 A1 | 3/2006 | Schmidt et al. |
| 2007/0221156 A1 | 9/2007 | Hagiwara et al. |
| 2009/0194051 A1 | 8/2009 | Smith et al. |
| 2009/0257927 A1 | 10/2009 | Ramaswamy et al. |
| 2010/0282197 A1 | 11/2010 | Permuy et al. |
| 2011/0146607 A1* | 6/2011 | Smith ............... F02P 9/007 123/143 B |
| 2011/0175691 A1 | 7/2011 | Smith et al. |
| 2011/0227673 A1 | 9/2011 | Patrick et al. |
| 2012/0192825 A1 | 8/2012 | Trump |
| 2012/0258016 A1 | 10/2012 | Makita et al. |
| 2013/0003251 A1 | 1/2013 | Durham et al. |
| 2013/0199508 A1 | 8/2013 | Toedter et al. |
| 2014/0041611 A1 | 2/2014 | Ikeda et al. |
| 2014/0326206 A1 | 11/2014 | Ikeda |
| 2014/0345552 A1 | 11/2014 | Ando et al. |
| 2015/0010439 A1 | 1/2015 | Ikeda |
| 2015/0027395 A1 | 1/2015 | Uchida et al. |

OTHER PUBLICATIONS

F.A. Pertl and J.E. Smith, Electromagnetic design of a novel microwave internal combustion engine ignition source, the quarter wave coaxial cavity igniter, Jun. 12, 2009, 14 pages, Proc. IMechE vol. 223 Part D: J. Automobile Engineering, U.S.A.

Dustin L. McIntyre, Gregory J. Thompson and James E. Smith, The Coaxial Cavity Resonator as a RF IC Engine Ignition Source, SAE Technical Paper Series, 2001-01-0987, SAE 2001 World Congress, Mar. 5-8, 2010, 14 pages, The Engineering Society for Advancing Mobility Land Sea Air and Space International, U.S.A.

Franz A. Pertl and James E. Smith, High-Level Modeling of an RF Pulsed Quarter Wave Coaxial Resonator with Potential use as a SI Engine Ignition Source, SAE Technical Paper Series 2008-01-0089, 2008 World Congress, Apr. 14-17, 2008, 7 pages, SAE International.

Franz A. Pertl, Mary Ann Clarke and James E. Smith, Design of a compact quarter wave coaxial cavity resonator for plasma ignition applications, International Journal of Microwave and Wireless Technologies,Cambridge University Press and the European Microwave Association, 2011, 7 pages, U.S.A.

Jay P. Wilhelm, Franz A. J. Pertl, Patrick Wildfire and James E. Smith, Ignition Energy Testing of the Quarter Wave Coaxial Cavity Resonator with Air-Liquefied-Petroleum-Gas Mixtures, Article, American Institute of Aeronautics and Astronautics 2008-3775, 10 pages.

Andrew D. Lowery, Franz A. Pertl and James E. Smith, Experimental Investigation of Dielectrics for Use in Quarter Wave Coaxial Resonators, SAE Technical Paper Series 2007-01-0256, 2007 World Congress, Apr. 16-19, 2007, 8 pages.

C.A. Stevens, F.A. Pertl, J.L. Hoke, F.R.Schauer and J.E. Smith, Comparative testing of a novel microwave ignition source, the quarter wave coaxial cavity igniter, Proceedings of the Institution of Mechanical Engineers, Part D: Journal of Automobile Engineering 2011 225: 1633, originally published online Aug. 22, 2011, published by Sage Publications, 9 pages, U.S.A.

\* cited by examiner

DUAL SIGNAL COAXIAL CAVITY RESONATOR PLASMA GENERATION

RELATED APPLICATIONS

This application claims priority to and the full benefit of U.S. Provisional Patent application 61/976,843, filed Apr. 8, 2014, which is incorporated by reference.

TECHNICAL FIELD

This technology relates generally to the field of electrical ignition of combustible materials, and more particularly to applications and methods of generating a plasma to ignite combustible materials.

BACKGROUND

There are at least two basic methods used to ignite combustion mixtures in the prior art. Auto ignition through compression and spark ignition. Today a very large number of spark ignited (SI) engines are in use, consuming a limited fossil fuel supply. A significant environmental and economic benefit is obtained by making combustion engines more efficient. Higher thermal efficiencies for SI engines are obtained through operation with leaner fuel air mixtures and through operations at higher power densities and pressures. Unfortunately, as mixtures are leaned, they become more difficult to ignite and combust. More energetic sparks with larger surfaces are required for reliable operation, for example using multiple spark plugs per cylinder systems or rail-plug igniters. As more energetic sparks are used, their overall ignition efficiency is reduced because the higher energy levels are detrimental to the spark plug lifetime. This needs work. These higher energy levels also contribute to the formation of undesirable pollutants plus the overall reduction in engine efficiency.

Radio frequency (RF) plasma ignition sources provide an alternative to traditional direct current (DC) spark ignition and open the door to more efficient, leaner, and cleaner combustion resulting in associated economic and environmental benefits. One method of generating plasma involves using a RF source and standing electromagnetic waves to generate corona discharge plasma. The prior art uses a RF oscillator and amplifier to generate the required RF power at a desired frequency. RF oscillators and amplifiers can be either semiconductor or electron tube based, and are well known in the art. The RF oscillator and amplifier are coupled to the quarter wave coaxial cavity resonator, which in turn develops a standing RF wave in the cavity at the frequency determined by the RF oscillator and the resonant frequency of the cavity. By electrically shorting the input end of the quarter wave coaxial cavity resonator and leaving the other end electrically open, the RF energy is resonantly stepped-up in the cavity to produce a corona discharge plasma at the open end of the quarter wave coaxial cavity resonator. The corona discharge plasma can function generally as an ignition means for combustible materials and specifically in a combustion chamber of a combustion engine.

SUMMARY

Each of the following summary paragraphs describes a non-limiting example of how the invention may be implemented as a combination of structural or method elements disclosed by the detailed description that follows. Any one or more of the elements of each summary paragraph may be utilized with any one or more of the distinct elements of another.

A plasma generator includes an assembly of quarter wave coaxial cavity resonators coupled in a series arrangement. The resonators include center conductors with proximal ends coupled to a radio frequency power source, and also include a virtual short circuit. A direct current power source is connected to the resonator assembly proximal to the virtual short circuit.

A plasma generator includes quarter wave coaxial cavity resonators. The resonator includes a center conductor that is coupled to a radio frequency power source, and also having a distal end configured to maintain a virtual short circuit. The apparatus further includes an open end discharge coaxial cavity resonator including a center conductor with a proximal end coupled to the virtual short circuit. A direct current power source is connected to the proximal end of the open end discharge quarter wave coaxial cavity resonator.

A plasma generator comprises a radio frequency power source, a coaxial cavity resonator, and a direct current power source. To describe the operation of this dual source device, the ratios of the two power sources are referenced. The radio frequency power source provides a voltage supply of radio frequency power having a first ratio of power over voltage. The resonator includes a center conductor coupled to the radio frequency power source, and also includes a virtual short circuit. The direct current power source is connected to the center conductor at the location of the virtual short circuit, and provides a voltage supply of direct current power having a second ratio of power over voltage ratio that is less than the first ratio.

A plasma generator comprises a first quarter wave coaxial cavity resonator assembly including a first center conductor and configured to maintain a first electrical length, the first quarter wave coaxial cavity resonator assembly having a first proximal end and a first distal end. The generator further comprises a second quarter wave coaxial cavity resonator assembly including a second center conductor, the second quarter wave coaxial cavity resonator assembly having a second proximal end and a second distal end, wherein the first quarter wave coaxial cavity resonator assembly and the second quarter wave coaxial cavity resonator assembly are arranged relative to one another such that the second proximal end connects to the first distal end at a point of connection. Direct current may be supplied through a direct current power input line connected adjacent to the point of connection between the first and second quarter wave coaxial cavity resonator assemblies.

A plasma generator comprises a center conductor configured to maintain an electrical length of an integer multiple of quarter wavelengths, wherein the center conductor has a proximal end, a distal end, and a resonant portion configured to resonate. The generator further comprises an outer conductor arranged around the center conductor. A combination of power may be provided through a direct current power input line connected to the center conductor, and a radio frequency power coupling means arranged in a coupling relationship to the resonant portion of the center conductor.

A plasma generator comprises a center conductor configured to maintain an electrical length of an integer multiple of quarter wavelengths. The generator further comprises an outer conductor surrounding the center conductor. A combination of power may be provided through a radio frequency control component disposed along the center conductor, and a direct current power input line connected to the radio frequency control component.

A quarter wave coaxial cavity resonator assembly comprises an interior center conductor portion having a first proximal end and a first distal end and an exterior center conductor portion having a second proximal end and a second distal end. The quarter wave coaxial cavity resonator assembly further comprises a connecting center conductor portion connected to the interior center conductor portion and the exterior center conductor portion. The assembly is configured such that an inner conducting path has an electrical length that is an integer multiple of a quarter wavelength, and is defined from the first proximal end directly to the first distal end, and an outer conducting path has an electrical length longer than the electrical length of the inner conducting path by an integer multiple of a half wavelengths, and is defined from the first proximal end to the connecting center conductor portion to the second proximal end to the second distal end to the connecting center conductor portion to the first distal end. A direct current power may be provided through a direct current power input line connected to the first proximal end.

A plasma generator comprises a center conductor configured to maintain a virtual short location under the influence of a radio frequency power source, and an outer conductor arranged around the center conductor. A direct current power input line is connected to the center conductor proximal to the virtual short location, wherein the direct current power input line is configured to receive a voltage supply of direct current power from a direct current power source.

A vehicle comprises a chassis, a drivetrain, a set of wheels, a fuel source, an oxygen inlet, a combustion chamber, a radio frequency power source, a direct current power source, and a plasma generator exposed to the combustion chamber. The plasma generator comprises a coaxial cavity resonator assembly including a center conductor that is oriented in a coupling arrangement to a radio frequency coupling means that is connected to the radio frequency power source, wherein the coaxial cavity resonator assembly is configured such that the center conductor is configured to maintain a virtual short location. Direct current power is provided through a direct current power input line that is connected to the direct current power source, wherein the direct current power input line is connected to the center conductor proximal to the virtual short location.

A vehicle comprises a chassis, a directional fin, a steering apparatus, a fuel source, an oxygen inlet, a combustion chamber, a radio frequency power source, a direct current power source, and a plasma generator exposed to the combustion chamber. The plasma generator comprises a coaxial cavity resonator assembly including a center conductor that is oriented in a coupling arrangement to a radio frequency coupling means that is connected to the radio frequency power source, wherein the coaxial cavity resonator assembly is configured such that the center conductor is configured to maintain a virtual short location. Direct current power is provided through a direct current power input line that is connected to the direct current power source, wherein the direct current power input line is connected to the center conductor proximal to the virtual short location.

A engine comprising a fuel inlet, an oxygen inlet, a combustion environment, and a plasma generator exposed to the combustion chamber. The plasma generator comprises a coaxial cavity resonator assembly including a center conductor that is oriented in a coupling arrangement to a radio frequency coupling means that is connected to a radio frequency power source, wherein the coaxial cavity resonator assembly is configured such that the center conductor is configured to maintain a virtual short location. Direct current power is provided through a direct current power input line that is connected to the direct current power source, wherein the direct current power input line is connected to the center conductor proximal to the virtual short location.

A ignition system comprising an electronic ignition controller and a plasma generator. The plasma generator comprises a coaxial cavity resonator assembly including a center conductor that is oriented in a coupling arrangement to a radio frequency coupling means that is connected to a radio frequency power source, wherein the coaxial cavity resonator assembly is configured such that the center conductor is configured to maintain a virtual short location. Direct current power is provided through a direct current power input line that is connected to the direct current power source, wherein the direct current power input line is connected to the center conductor proximal to the virtual short location.

An apparatus generates a plasma corona under the influence of a threshold amount of voltage necessary to initiate a plasma. The apparatus includes a radio frequency power source that provides a voltage supply of radio frequency power having a first ratio of power over voltage. An open end discharge coaxial cavity resonator includes a center conductor that is coupled to the radio frequency power source, and having a distal end exposed to a combustion chamber. The resonator also includes a virtual short circuit. A direct current power source is connected to the center conductor proximal to the virtual short circuit. The direct current power source provides a voltage supply of direct current power which has a second ratio of power over voltage, and which together with the voltage supply of radio frequency power meets or exceeds the threshold voltage. The first ratio is greater than the second ratio.

An apparatus generates a plasma under the influence of a threshold amount of voltage necessary to initiate a plasma. The apparatus includes a radio frequency power source that provides a voltage supply of radio frequency power. A coaxial cavity resonator includes a center conductor that is coupled to the radio frequency power source, and also includes a virtual short circuit. A direct current power source provides a voltage supply of direct current power to the resonator at the virtual short circuit. The voltage supply of direct current power together with the voltage supply of radio frequency power meets or exceeds the threshold amount of voltage required for breakdown. The direct current power source further provides the voltage supply of direct current power in a range with a lower limit of about 51 percent and an upper limit less than 100 percent of the threshold amount of voltage.

A method generates a plasma in a coaxial cavity resonator assembly by providing a combined amount of voltage from radio frequency power and direct current power. The method provides a first portion of voltage to the resonator assembly from radio frequency power. The first portion of voltage, which alone is insufficient to initiate a plasma at a distal end of the resonator assembly, defines a first ratio of power over voltage. The method further provides a second portion of voltage to the resonator assembly from direct current power. The second portion of voltage, which alone is insufficient to initiate a plasma at the distal end of the resonator assembly, defines a second ratio of power over voltage. The method generates a plasma at the distal end of the resonator assembly by providing the combined amount of voltage from the first portion of voltage and the second portion of voltage, wherein the second ratio is less than the first ratio.

A method generates a plasma in a coaxial cavity resonator assembly by providing a combined amount of voltage from radio frequency power and direct current power. The method provides a first portion of voltage to the resonator assembly from radio frequency power. The first portion of voltage alone is insufficient to initiate a plasma at a distal end of the resonator assembly. The method also provides a second portion of voltage to the resonator assembly from direct current power. The second portion of voltage alone is insufficient to initiate a plasma at the distal end of the resonator assembly, but is more than 51 percent of the combined amount of voltage sufficient to initiate a plasma at the distal end of the resonator assembly. The method generates a plasma at the distal end of the resonator assembly by providing the combined amount of voltage from the first portion of voltage and the second portion of voltage.

BRIEF DESCRIPTION OF THE DRAWINGS

A brief description of each figure is provided below. Elements with the same reference numbers in each figure indicate identical or functionally similar elements. Additionally, as a convenience, the left-most digit(s) of a reference number identifies the drawings in which the reference number first appears.

DETAILED DESCRIPTION

This written description is provided to meet the enablement requirements of the patent statute without imposing limitations that are not recited in the claims. All or part of each example may be used in combination with all or part of any one or more of the other examples.

Prior Art Ignition System with a Spark Plug

Figure 1:
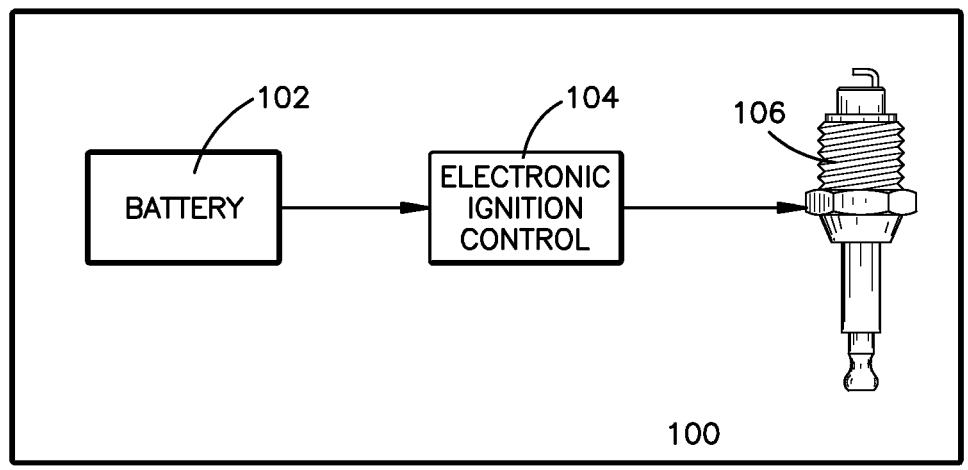
FIG. 1 is a schematic diagram of a prior art ignition system using a spark plug as an ignition source.

Referring now to the schematic diagram of a prior art ignition system 100 depicted in FIG. 1, a battery 102 connects to an electronic ignition control system 104 which is connected by a spark plug wire to a spark plug 106.

In a typical prior art ignition system 100, like that found in an automobile, a battery 102 provides electrical power to an electronic ignition control system 104. The electronic ignition control system 104 determines the proper timing for triggering an ignition event, and at the appropriate time sends a high voltage direct current (DC) pulse via a spark plug wire to the terminal end of a spark plug 106. The high voltage pulse causes a spark to discharge at the tip of the spark plug 106 that is displaced inside of a combustion chamber (not shown). The spark ignites combustible material, such as gasoline vapor, that is inside the combustion chamber of a combustion engine, completing the ignition sequence.

Prior Art Ignition System with a Coaxial Cavity Resonator

Figure 2:
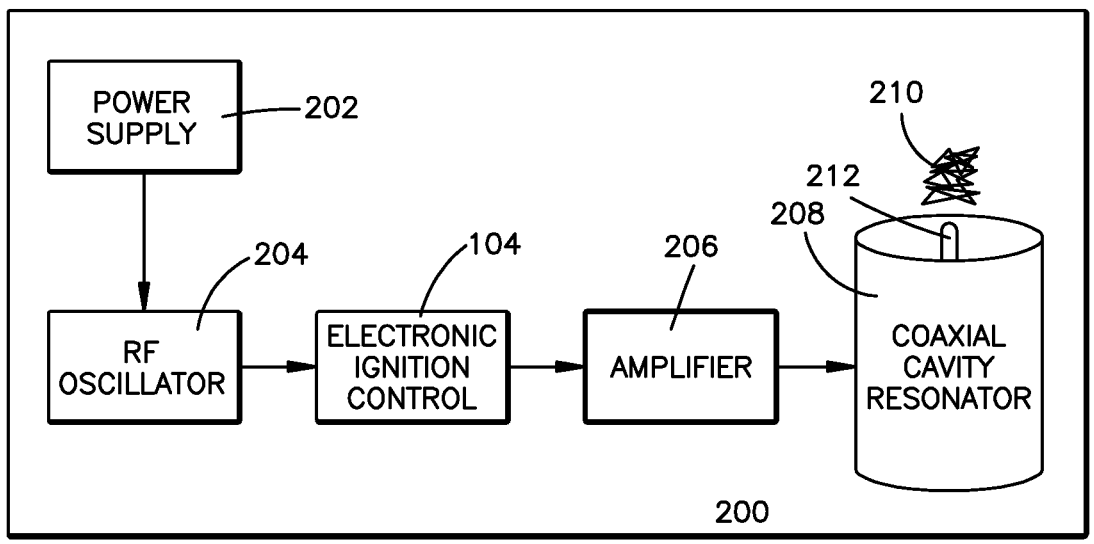
FIG. 2 is a schematic diagram of a prior art ignition system using a coaxial cavity resonator as an ignition source.

Referring now to the schematic diagram of a prior art coaxial cavity resonator ignition system 200 depicted in FIG. 2, a power supply 202 connects to a radio frequency (RF) oscillator 204 that is connected through an electronic ignition control system 104 to an amplifier 206 that is connected to a coaxial cavity resonator 208. An exemplary system using a coaxial cavity resonator 208 is described in U.S. Pat. No. 5,361,737 to Smith et al. herein incorporated by reference as part of this description. Also incorporated by reference as part of this description are U.S. Patent Publications 2011/0146607 and 2011/0175691. A coaxial cavity resonator may also be referred to as a quarter wave coaxial cavity resonator (QWCCR).

In one example of the prior art coaxial cavity resonator ignition system, the power supply 202 provides electrical power to an RF oscillator 204. The RF oscillator 204 generates an RF signal at a frequency chosen to approximate the resonant frequency of the coaxial cavity resonator 208. The RF oscillator 204 delivers the RF signal to an electronic ignition control system 104 that determines the proper timing for triggering an ignition event, and at the appropriate time forwards the RF signal to the amplifier 206 for amplification. The amplifier 206 amplifies the RF signal to the proper power to create sufficiently energetic corona discharge plasma 210 at the discharge tip of a center conductor of the coaxial cavity resonator 208 to ignite a combustible material in the combustion chamber of a combustion engine. The particular combination of components that provide the RF signal to the QWCCR may vary in different examples of the prior art.

The QWCCR 208 creates microwave plasma by inducing electrical breakdown of a gas mixture using an electric field. In one example, the prior art QWCCR 208 consists of a quarter wavelength resonant coaxial cavity into which electromagnetic energy is coupled resulting in a standing electromagnetic field. The RF oscillations are between about 750 MHz and 7.5 GHz. A coaxial cavity resonator 208 measuring between 1 to 10 cm long approximately corresponds to an operating frequency in the range of 750 Mhz to 7.5 Ghz. The advantage of generating frequencies in this range is that it allows the geometry of a body containing the coaxial cavity resonator 208 to be dimensioned approximately the size of the prior art spark plug 106.

Ignition System with a Coaxial Cavity Resonator Using Both Radio Frequency Power and Direct Current Power In accordance with the present invention, an apparatus may further be configured using multiple resonators assembled in a configuration to generate a plasma by applying a combined amount of voltage from radio frequency power and direct current power. Such an apparatus 300 is shown for example in FIG. 3. In this particular example, the apparatus 300 is an assembly of two quarter wave coaxial cavity resonators that are coupled together. More specifically, the resonator assembly 300 shown for example in FIG. 3 includes first and second resonators 310 and 312 coupled in a series arrangement along a longitudinal axis 315.

In the illustrated example, the first and second resonators 310 and 312 are defined by a common outer conductor wall structure 320. The wall structure 320 includes first and second cylindrical walls 322 and 324 centered on the axis 315. The first wall 322 is constructed of a conducting material and surrounds a first cylindrical cavity 325 centered on the axis 315. The thickness of this material is based on its dielectric breakdown strength. It needs to be strong enough to suppress the current from the outer conductor to the inner conductor. In this example, the first cylindrical cavity 325 is filled with a dielectric material 326 having a relative dielectric constant approximately equal to four ($\epsilon_r$=4). In this example, the first and second resonators 310 and 312 adjoin one another in a connection plane 332 that is perpendicular to the axis 315. In other examples, the connection plane 332 does not have to be perpendicular, and can change at any rate that maintains a constant impedance between the first and second resonators 310 and 312.

The second cylindrical wall 312 is constructed of a conducting material and surrounds a second cavity 345 that is also centered on the axis 315. The second cavity 345 is coaxial with the first cavity 325 but has a greater physical length. The second wall 312 provides the second cavity 345 with a distal end 347 spaced along the longitudinal axis 315 from the proximal end 349 of the second cavity 345.

A center conductor structure 350 is supported within the wall structure 320 of the resonator assembly 300 by the dielectric material 326. The center conductor structure 350 includes first and second center conductors 352 and 354 and a radial conductor 357. The first center conductor 352 reaches within the first cavity 325 along the axis 315. In the illustrated example, the first center conductor 352 has a proximal end 360 adjacent the proximal end 330 of the first cavity 325, and has a distal end 362 adjacent the distal end 349 of the first cavity 325. The radial conductor 357 projects radially from a location adjacent the distal end 362 of the first center conductor 352, across the first cavity 325, and outward through the aperture 339.

The second center conductor 354 has a proximal end 370 at the distal end 362 of the first center conductor 352, and projects along the axis 315 to a distal end 372 configured as an electrode tip located at or in close proximity to the distal end 347 of the respective cavity 345.

To minimize any mismatch in impedances between the first and second resonators 310 and 312, the relative radial thicknesses between both the cylindrical walls 322 and 324 and the respective center conductors 352 and 354 are defined in relation to the relative dielectric constant of the dielectric material 326 and the dielectric constant of the air that fills the second cavity 345. In the illustrated example, the physical length along the longitudinal axis 315 of the second center conductor 354 is approximately twice the physical length along the longitudinal axis 315 of the first center conductor 352. However, based at least in part on the dielectric material 326 having a relative dielectric constant approximately equal to four, the electrical lengths of the two center conductors are approximately equal. Note: any gaps between any center conductor and any outer conductor are either filled with a dielectric, or the gap is large enough to minimize arcing. As further shown in FIG. 3, the dielectric material 326 fills the first cavity 325 around the first center conductor 352 and the radial conductor 357.

Figure 3:
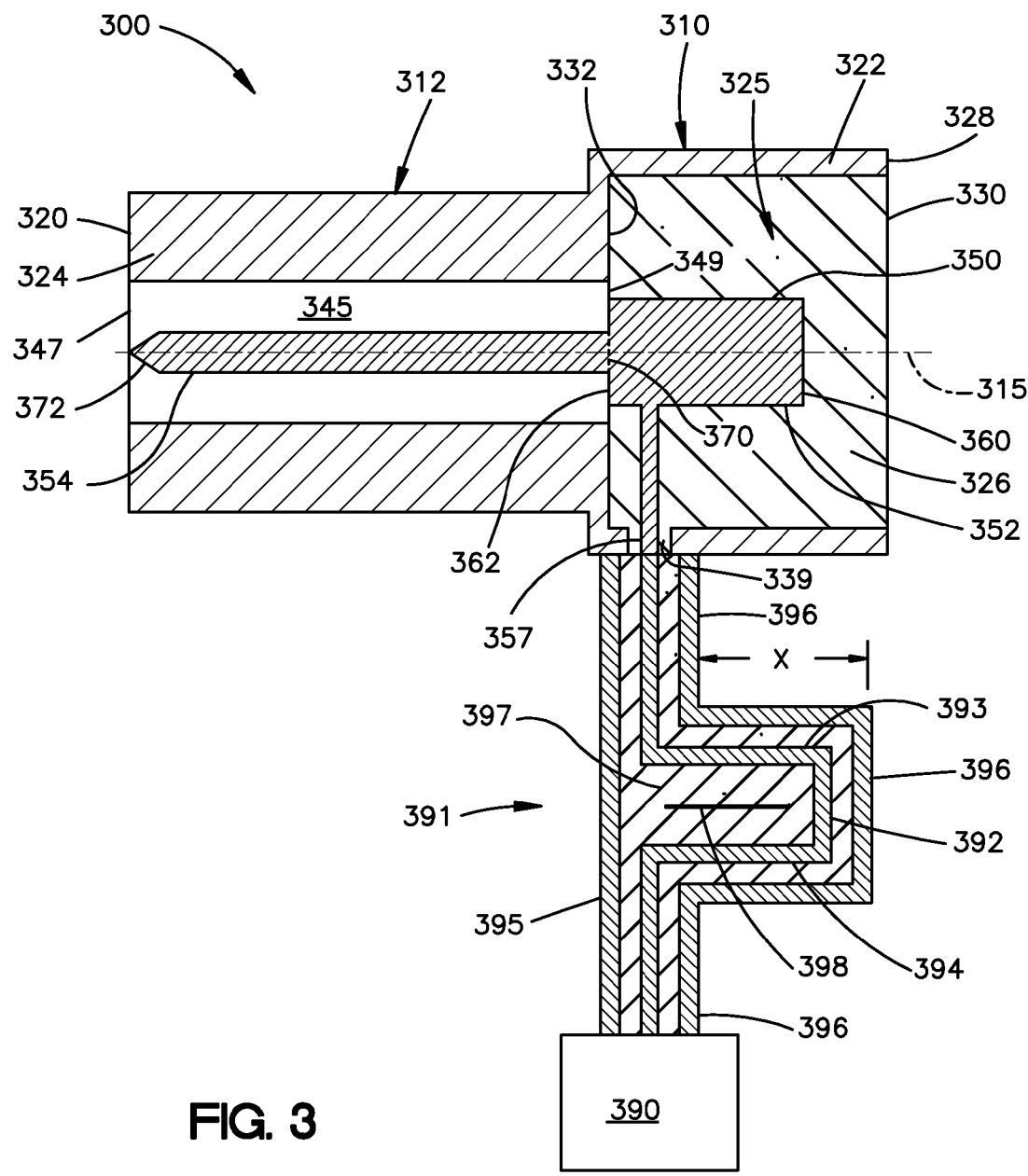
FIG. 3 is a cross-sectional view of an example of an exemplary coaxial cavity resonator assembly connected to a direct current power source through an additional resonator assembly acting as an RF attenuator.

In the illustrated example, a DC power source 390 is connected to the center conductor structure 350 through the radial conductor 357 connected adjacent to the virtual short circuit point. An RF control component, specifically, an RF frequency cancellation resonator assembly 391 is disposed between the radial conductor 357 and the DC power source 390 to restrict RF power from reaching the DC power source 390. The RF frequency cancellation resonator assembly is an additional resonator assembly 391 having a center conductor 392 with first and second portions 393 and 394, each of which has the same electrical length, X, as one another (and the same electrical length as the first and second center conductors 352 and 354). In a preferred example, the electrical length X denoted in FIG. 3 is equal to one quarter wavelength, or lambda/4, wherein wavelength is inversely related to the frequency of the RF power. The additional resonator assembly 391 also has a short outer conducting wall 395 and a long outer conducting wall 396. The short outer conducting wall 395 has first and second ends on opposite ends of the additional resonator assembly 391. The long outer conducting wall 396 also has first and second ends on opposite ends of the additional resonator assembly 391. The first and second ends of the short outer conducting wall 395 are each on the opposite side from the corresponding first and second ends of the long outer conducting wall 396.

The difference in electrical length between the short outer conducting wall 395 and the long outer conducting wall 396 is approximately equal to the combined electrical length of the first and second portions 393 and 394, which is also approximately equal to twice the electrical length of the first center conductor 352. The short outer conducting wall 395 and the long outer conducting wall 396 surround a cavity 397 filled with a dielectric material. Under active operation in this example, current running along the outer conductor of the additional resonator assembly 391 will primarily follow the shortest path and run along the short outer conducting wall 395. Accordingly, current on the outer conductor of the additional resonator assembly 391 will travel two fewer quarter wavelengths than current running along the center conductor 392 of the additional resonator assembly 391.

The additional resonator assembly 391 also has an internal conducting ground plane 398 disposed within the cavity 397 and between the first and second portions 393 and 394 of the center conductor 392. This arrangement provides a frequency cancellation circuit connected between the DC power source 390 and the radial conductor 357. The additional resonator assembly 391 is configured to shift a voltage supply of RF energy 180 degrees out of phase relative to the ground plane of the QWCCR assembly 300 due to the difference in electrical length between the short outer conducting wall 395 and the center conductor 392 of the additional resonator assembly 391.

Figure 4:
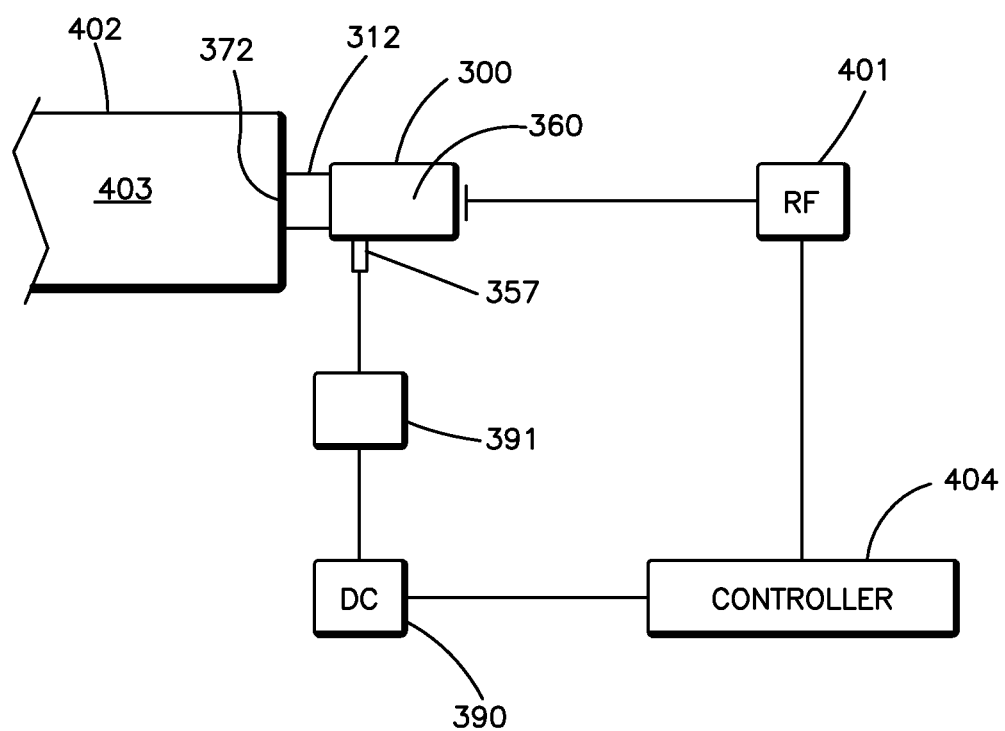
FIG. 4 is a schematic diagram of an example of a coaxial cavity resonator assembly operatively associated with a combustion chamber and wherein a controller directs both an RF power supply and a DC power supply to provide power to the coaxial cavity resonator assembly.

As shown schematically in FIG. 4, an RF power source 401 is coupled to the QWCCR assembly 300 across from the first center conductor 352, which is joined to a cylinder 402 in an internal combustion engine, with the electrode tip 372 exposed in a combustion chamber 403 in the cylinder 402. In this preferred example, a controller 404 is coupled to the RF power source 401 and the DC power source 390 for directing the power sources to supply voltages within specific parameters. The controller 404 may comprise any suitable programmable logic controller or other control device, or combination of control devices, that can be programmed or otherwise configured with hardware and/or software to perform as described and claimed.

When a plasma is to be generated adjacent the electrode tip 372 of the second center conductor 354, the controller 404 directs the RF power source 401 to capacitively couple a voltage supply of RF energy to the first center conductor 352, thereby creating a virtual short adjacent the distal end 362 of the first center conductor 352. This virtual short also couples the voltage supply of RF energy to the second center conductor 354. The voltage supply of RF energy is not sufficient on its own to generate a plasma, and is provided in a first ratio of power over voltage. The controller 404 also directs the DC power source 390 to provide a voltage supply of DC power that is not sufficient on its own to generate a plasma. The voltage supply of DC power is provided in a second ratio of power over voltage that is less than the first ratio of power over voltage associated with the voltage supply of RF energy. The combined voltage from RF energy and DC power is sufficient to generate a plasma. As a result, a plasma is generated adjacent the electrode tip 372 of the second center conductor 354. Determination of the combined voltage sufficient to generate a plasma may be made by the controller 404 in response to conditions measured relative to the combustion chamber 403.

In alternative examples, the controller 404 is capable of modes of configuration in which more than 51 percent of the voltage sufficient to initiate a plasma at the distal end 372 is provided from the DC power source 390.

In alternative examples, introduction of the voltage supply of DC power is not limited to the particular virtual short location described above, but rather may be provided near any other virtual short that may be present so as to ensure that the high voltage DC power will have a minimal effect on the standing electromagnetic wave being formed by the RF power component, and to limit RF power from disturbing the DC power source.

In alternative examples, either, or both, the DC power source 390 and RF power source 401 may include their own dedicated controllers for directing the provision of a combination of power adequate to generate a plasma at the electrode tip 372; or either, or both, the DC power source 390 and RF power source 401 may be provided within a primary power source. Wherein the primary power source may be configured to control the power output between the DC power source 390 and RF power source 401. In varying examples, the controller 404 may be disposed before or after either or both of the DC power source 390 and the RF power source 401, and the controller 404 may equally be integrated within or without the physical components that house the DC power source 390 and the RF power source 401. The coupling of the RF power source 401 to the center conductors may be enabled by several means: inductive coupling (e.g., an induction feed loop), parallel capacitive coupling (e.g., a parallel plate capacitor), or non-parallel capacitive coupling (e.g., an electric field applied opposite a non-zero voltage conductor end). The particular coupling arrangement employed will depend on the choice of coupling means and the particular structure of the resonator cavities.

In alternative examples, the RF frequency cancellation resonator assembly 391 may be any component, or series of components, for isolating RF power from reaching the DC power source 390, including, but not limited to: a resistive element, a lumped element inductor, a frequency cancellation circuit. In alternative examples, the RF frequency cancellation resonator assembly 391 may be located in closer proximity to the DC power source 390, the RF frequency cancellation resonator assembly 391 may be located in closer proximity to the QWCCR assembly 300, or the RF frequency cancellation resonator assembly 391 may be located somewhere else between the DC power source 390 and the resonator assembly 300. It is desirable to remove the RF as close to the point of generation as possible to reduce the amount of energy lost to heating, and to keep a high quality factor in the resonator assembly.

In alternative examples, the teachings of the present disclosure may be applied to a resonator assembly containing as few as one QWCCR, or to assemblies containing multiple QWCCRs arranged in series. Regardless of the number of QWCCRs used, comparatively the introduction of a (higher voltage, lower power) voltage supply of DC power at a virtual short in combination with a (lower voltage, higher power) voltage supply of RF power will provide a more efficient system for generating a plasma in a greater range of combustion environments while reducing the overall energy requirements for improved combustion and improved overall engine efficiency. By using the voltage supply of DC power as described above, a very large electrical potential is introduced to the system with a negligible use of current or power, in comparison to the RF power used to generate a plasma.

Figure 5:
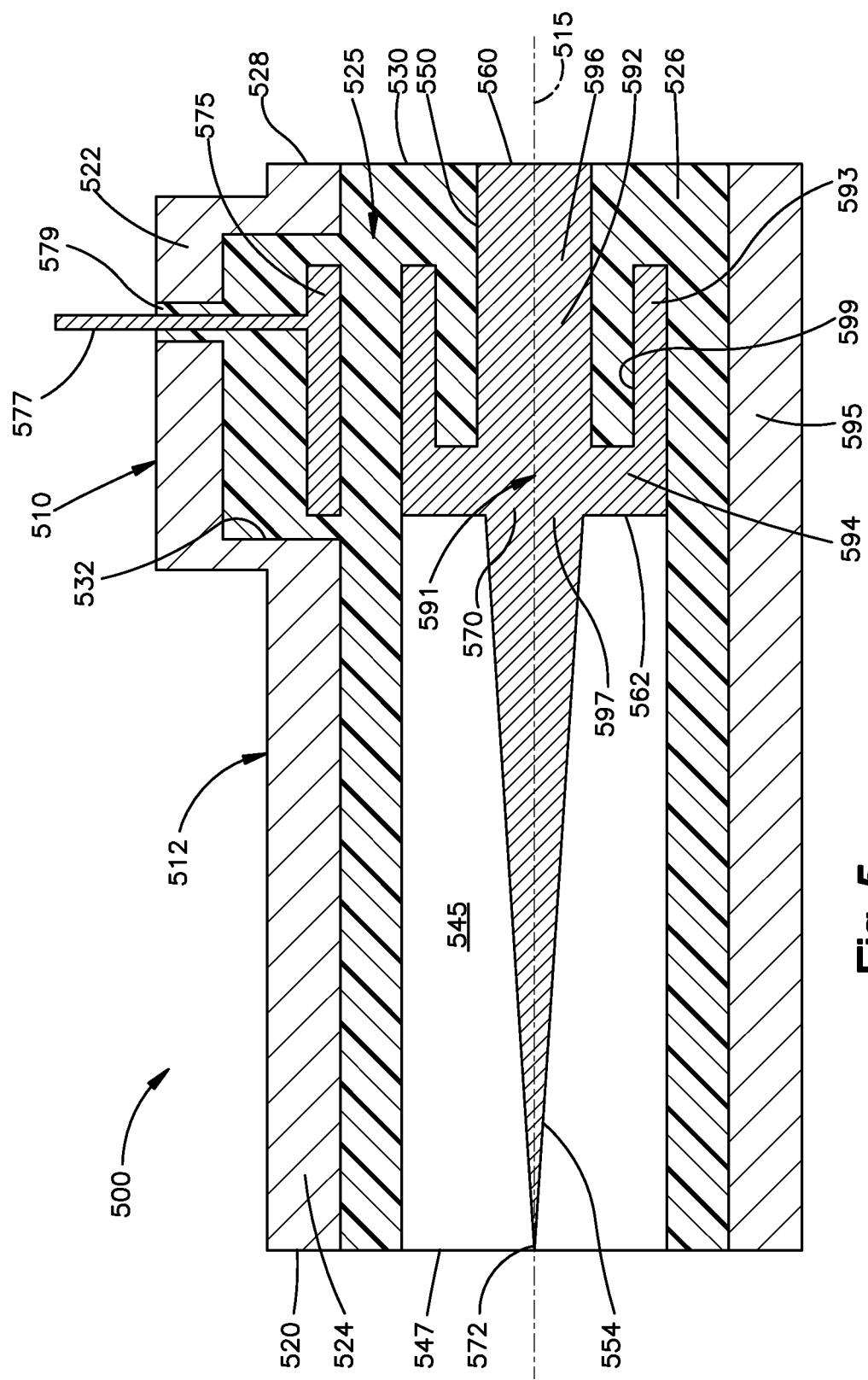
FIG. 5 is a cross-sectional view of an example of an exemplary coaxial cavity resonator assembly connected to a direct current power source through an additional resonator assembly acting as an RF attenuator.

In accordance with the present invention, an apparatus may further be configured using two resonators assembled in a series configuration to generate a plasma by applying a combined amount of voltage from radio frequency power and direct current power, such an apparatus 500 is shown for example in FIG. 5. In this particular example, the apparatus 500 includes first and second resonator portions 510 and 512 coupled in a series arrangement along a longitudinal axis 515.

In the illustrated example, the first and second resonator portions 510 and 512 are defined by a common outer conductor wall structure 520. The wall structure 520 includes first and second cylindrical wall portions 522 and 524 centered on the axis 515. The first wall portion 522 is constructed of a conducting material and surrounds a first cylindrical cavity 525 centered on the axis 515. In this example, the first cylindrical cavity 525 is filled with a dielectric material 526. An annular edge 528 of the first wall portion 522 defines a proximal end 530 of the first cavity 525. A proximal end of the second cylindrical wall portion 524 adjoins a distal end 532 of the first cavity 525.

The second center conductor portion 554 has a proximal end 570 adjoining the distal end 562 of the first center conductor portion 552, and projects along the axis 515 to a distal end 572 configured as an electrode tip located at or in close proximity to the distal end 547 of the second cavity 545.

An aperture 579 reaches radially outward through the first wall portion 522 through which a radial conductor 577 extends out from the longitudinal axis 515 for connection to the RF power source 401 by an RF power input line. The end of the radial conductor 577 that is closer to the longitudinal axis 515 connects to a parallel plate capacitor 575 that is in a coupling arrangement to the center conductor structure 550. The parallel plate capacitor 575 is also in a coupling arrangement to an inline folded RF attenuator 591.

In the illustrated example, a DC power source 390 is connected to the center conductor structure 550 at its proximal end 560 with a DC power input line. The inline folded RF attenuator 591 is disposed between the second resonator portion 512 and the DC power source 390 to restrict RF power from reaching the DC power source 390. The inline folded RF attenuator 591 includes an interior center conductor portion 592 having a first proximal end 596 and a first distal end 597. The inline folded RF attenuator 591 also includes an exterior center conductor portion 593 and a transition center conductor portion 594 that connects interior center conductor portion 592 and the exterior center conductor portion 593. The exterior center conductor portion 593 has a proximal end largely in the same plane as the first proximal end 596, and a distal end largely in the same plane as the first distal end 597. In this example, the transition center conductor portion 594 is located proximal to the first distal end 597. The exterior center conductor portion 593 surrounds the interior center conductor portion 592.

In this example, the exterior center conductor portion 593 resembles a cylindrical portion of conducting material surrounding the rest of the interior center conductor portion 592. The longitudinal lengths of the interior center conductor portion 592 and the exterior center conductor portion 593 are approximately equal to the longitudinal length of the parallel plate capacitor 575 that they are in coupling arrangement with. The electrical length between the first proximal end 596 to the first distal end 597, for both the interior center conductor portion 592 and the exterior center conductor portion 593, is approximately equal to one quarter wavelength. The second center conductor 554 and the second cylindrical wall portion 524 are both configured to have an electrical length of one quarter wavelength.

The wall structure 520 includes a short outer conducting portion 595 which has a proximal end largely in the same plane as the first proximal end 596, and a distal end largely in the same plane as the first distal end 597. An outer conducting path runs from the distal end of the wall structure 520 (that is substantially coplanar with the distal end 547 of the second cavity 545), along the short outer conducting portion 595, and stops at the proximal end 530 of the first wall portion 522. In this example, the outer conducting path has an electrical length of two quarter wavelengths.

An inner conducting path runs from the distal end electrode tip 572 to the proximal end 570 of the second center conductor portion 554, along the outside of the transition center conductor portion 594, then along the outside from the distal end to the proximal end of the exterior center conductor portion 593, then along the interior wall 599 of the exterior center conductor portion 593 from its proximal end to its distal end, then along the interior center conductor portion 592 from its distal end to its proximal end. In this example, the electrical length of this inner conducting path is four quarter wavelengths, or two half wavelengths. The difference in electrical lengths between the inner conducting path and the outer conducting path is one half wavelength.

This arrangement provides a radio frequency control component connected between the DC power source 390 and the voltage supply of RF energy. This particular example of a radio frequency control component is an inline folded RF attenuator 591 and is configured to shift a voltage supply of RF energy 180 degrees out of phase relative to the ground plane of the QWCCR assembly 500.

A person of ordinary skill in the art would understand that the particular QWCCR arrangement depicted in FIG. 5 is not limiting with regards to the orientation of the inline folded RF attenuator 591. In alternative examples, the entire QWCCR arrangement depicted in FIG. 5 may be 'stretched' whereby the inline folded RF attenuator 591 may be disposed further away from the distal end 572 and no longer directly coupled to the parallel plate capacitor 575, but rather separated by one quarter wavelength from the portion of the center conductor that would remain in direct coupling arrangement with the parallel plate capacitor 575. Alternatively, the entire QWCCR arrangement depicted in FIG. 5 could be more compressed whereby the exterior center conductor portions 593 of the inline folded RF attenuator 591 both extend longitudinally as far as the parallel plate capacitor 575 but also surround the portion of center conductor exposed for plasma creation. This may be implemented by arranging the transition center conductor portion 594 no longer just at the end of the inline folded RF attenuator 591 but in the middle so that the exterior center conductor portions 593 extend in either direction longitudinally. Any particular geometry of this arrangement would require tweaking to the various parameters of dielectrics to ensure impedance matching and full 180 degree phase cancellation, but these tasks are well understood engineering tasks.

In one example, the QWCCRs of the present invention and the particular combination of components that provide the RF signal to the QWCCR are contained in a body dimensioned approximately the size of the prior art spark plug 106 and adapted to mate with the combustion chamber of a combustion engine. More specifically, this example uses a microwave amplifier at the resonator and uses the resonator as the frequency determining element in an oscillator amplifier arrangement. The amplifier/oscillator would be attached at the top of the plug, and would have the high voltage supply also integrated in the module with diagnostics. This example permits the use of a single low voltage DC supply for feeding the module along with a timing signal.

In the context of this description various terms may refer to locations where as a result of a particular configuration, and under certain conditions of operation, a voltage component may be measured as close to non-existent. For example, "voltage short" may refer to any location where a voltage component may be close to non-existent under certain conditions. Similar terms may equally refer to this location of close-to-zero voltage, e.g., "virtual short circuit," "virtual short location," or "voltage null." Often times a person of ordinary skill in the art might limit the use of "virtual short" to only those locations where the close-to-zero voltage is a result of a standing wave crossing zero. "Voltage null" may at times more often be used to refer to locations of close-to-zero voltage for a reason other than as result of a standing wave crossing zero, e.g., voltage attenuation or cancellation. Moreover, in the context of this disclosure, each of these terms that can refer to locations of close-to-zero voltage are meant to be non-limiting, and instead only limited by their surrounding context including the particular dimensions and specifications of the application within which they are described.

The examples of the invention shown in the drawings and described above are exemplary of numerous examples that may be made within the scope of the appended claims. Additional examples of the invention may further include elements selected from any one or more of the prior art examples described above as needed to accomplish any desired implementation of the structure and function made available by the invention. It is the applicant's intention that the scope of the patent will be limited only by the scope of the appended claims.

What is claimed is:

1. A plasma generator comprising:
a source of radio frequency power;
a coaxial cavity resonator assembly including a center conductor that is both oriented in a coupling arrangement to the source of radio frequency power and is configured to maintain a voltage null at a first location; and
a source of direct current power connected to the center conductor proximal to the first location.

2. The plasma generator of claim 1, further comprising:
a radio frequency control component connected between the source of direct current power and the coaxial cavity resonator assembly, and configured to restrict the passage of a voltage supply of radio frequency power to the source of direct current power.

3. The plasma generator of claim 2, wherein the radio frequency control component is an additional resonator assembly configured to shift the voltage supply of radio frequency power 180 degrees out of phase relative to a ground plane of the coaxial cavity resonator assembly.

4. The plasma generator of claim 1, wherein the coaxial cavity resonator assembly comprises a plurality of quarter wave coaxial cavity resonators coupled in a series arrangement, the resonators including center conductors coupled to the source of radio frequency power.

5. The plasma generator of claim 1, further comprising:
a power source controller configured to direct the source of radio frequency power to provide a voltage supply of radio frequency power with a first ratio of power over voltage and configured to direct the source of direct current power to provide a voltage supply of direct current power with a second ratio of power over voltage, wherein the first ratio is greater than the second ratio.

6. A plasma generator comprising:
a radio frequency power source;
a coaxial cavity resonator assembly including a center conductor that is oriented in a coupling arrangement to the radio frequency power source and is configured to maintain a voltage null at a first location;
an open end discharge quarter wave coaxial cavity resonator including a center conductor having a proximal end coupled to the first location; and
a direct current power source connected proximal to the first location.

7. A plasma generator comprising:
a radio frequency power source configured to provide a voltage supply of radio frequency power having a first ratio of power over voltage;
a coaxial cavity resonator assembly including a center conductor that is oriented in a coupling arrangement to the radio frequency power source and is configured to maintain a voltage null at a first location; and
a direct current power source connected to the center conductor proximal to the first location and configured to provide a voltage supply of direct current power having a second ratio of power over voltage that is less than the first ratio.

8. A plasma generator comprising:
a radio frequency power source;
a coaxial cavity resonator assembly including a center conductor that is oriented in a coupling arrangement to the radio frequency power source and is configured to maintain a voltage null at a first location; and
a power source configured to provide a substantially constant voltage supply of direct current power to the coaxial cavity resonator assembly proximal to the first location.

9. An apparatus for generating a plasma under the influence of a threshold amount of voltage necessary to initiate a plasma, comprising:
a radio frequency power source configured to provide a voltage supply of radio frequency power with a first ratio of power over voltage;
a coaxial cavity resonator assembly including a center conductor that is oriented in a coupling arrangement to the radio frequency power source and is configured to maintain a voltage null at a first location; and
a direct current power source connected to the center conductor proximal to the first location and configured to provide a voltage supply of direct current power with a second ratio of power over voltage, and which together with the voltage supply of radio frequency power meets or exceeds the threshold voltage;
wherein the first ratio is greater than the second ratio.

10. The plasma generating apparatus of claim 9, wherein the direct current power source is configured to operate in a mode which provides the voltage supply of direct current power as a substantially constant voltage supply of direct current power.

11. The plasma generating apparatus of claim 9, further comprising:
a radio frequency control component connected between the direct current power source and the coaxial cavity resonator assembly, and configured to restrict the passage of the voltage supply of radio frequency power to the direct current power source.

12. The plasma generating apparatus of claim 11, wherein the radio frequency control component is an additional resonator assembly configured to shift the voltage supply of radio frequency power 180 degrees out of phase relative to a ground plane of the coaxial cavity resonator assembly.

13. The plasma generating apparatus of claim 9, further comprising:
a power source controller configured to direct the radio frequency power source and the direct current power source to provide a combined source of voltage that meets or exceeds the threshold voltage wherein the first ratio is greater than the second ratio.

14. An apparatus for generating a plasma under the influence of a threshold amount of voltage necessary to initiate a plasma, comprising:
a radio frequency power source configured to provide a voltage supply of radio frequency power;
a coaxial cavity resonator assembly including a center conductor that is oriented in a coupling arrangement to the radio frequency power source and is configured to maintain a voltage null at a first location;
a power source configured to provide a voltage supply of direct current power to the coaxial cavity resonator assembly at the first location, wherein the voltage supply of direct current power together with the voltage supply of radio frequency power meets or exceeds the threshold amount of voltage; and
wherein the power source is further configured to provide the voltage supply of direct current power in a range with a lower limit of about 51 percent and an upper limit less than 100 percent of the threshold amount of voltage.

15. The plasma generating apparatus of claim 14, wherein the power source is configured to operate in a mode which provides the voltage supply of direct current power as a substantially constant voltage supply of direct current power.

16. The plasma generating apparatus of claim 14, further comprising:
a radio frequency control component connected between the direct current power source and the coaxial cavity resonator assembly, and configured to restrict the passage of radio frequency power to the direct current power source.

17. The plasma generating apparatus of claim 16, wherein the radio frequency control component is an additional resonator assembly configured to shift the voltage supply of radio frequency power 180 degrees out of phase relative to a ground plane of the coaxial cavity resonator assembly.

18. The plasma generating apparatus of claim 14, further comprising:
a power source controller configured to direct the radio frequency power source to provide a voltage supply of radio frequency power with a first ratio of power over voltage and configured to direct the direct current power source to provide a voltage supply of direct current power with a second ratio of power over voltage, wherein the first ratio is greater than the second ratio.

19. A plasma generator, comprising:
a first quarter wave coaxial cavity resonator assembly including a first center conductor and configured to maintain a first electrical length, the first quarter wave coaxial cavity resonator assembly having a first proximal end and a first distal end;
a second quarter wave coaxial cavity resonator assembly including a second center conductor, the second quarter wave coaxial cavity resonator assembly having a second proximal end and a second distal end, wherein the first quarter wave coaxial cavity resonator assembly and the second quarter wave coaxial cavity resonator assembly are arranged relative to one another such that the second proximal end connects to the first distal end at a point of connection; and
a direct current power input line connected adjacent to the point of connection between the first and second quarter wave coaxial cavity resonator assemblies.

20. The plasma generator of claim 19, further comprising:
a radio frequency control component disposed along the direct current power input line.

21. The plasma generator of claim 20, wherein the radio frequency control component is an additional resonator assembly comprising:
a third center conductor portion configured to maintain a third electrical length and having a third proximal end and a third distal end; and
a first outer conducting wall portion configured to maintain a fourth electrical length having a fourth proximal end substantially coplanar to the third proximal end and a fourth distal end substantially coplanar to the third distal end, wherein the fourth electrical length is a shorter electrical length than the third electrical length by a difference in electrical lengths that is an integer multiple of twice the first electrical length.

22. A plasma generator, comprising:
a center conductor configured to maintain an electrical length of an integer multiple of quarter wavelengths, wherein the center conductor has a proximal end, a distal end, and a resonant portion configured to resonate;
an outer conductor arranged around the center conductor;
a direct current power input line connected to the center conductor; and
a radio frequency power coupling means arranged in a coupling relationship to the resonant portion of the center conductor.

23. The plasma generator of claim 22, wherein the direct current power input line is connected to the proximal end of the center conductor.

24. The plasma generator of claim 23, further comprising:
a radio frequency control component disposed in part along the center conductor between the distal end and the direct current power input line.

25. The plasma generator of claim 24, wherein the radio frequency control component is a folded resonator assembly comprising:
an outer conducting path; and
an inner conducting path having a shorter electrical length than the outer conducting path, wherein the inner conducting path and the outer conducting path have a difference in electrical lengths that is an integer multiple of a half wavelength.

26. The plasma generator of claim 25, wherein the radio frequency power coupling means comprises a curved plate oriented in parallel to the center conductor and extending a length along the center conductor that is an integer multiple of quarter wavelengths.

27. The plasma generator of claim 26, wherein the curved plate has a width that is about 40% of its length.

28. The plasma generator of claim 26, wherein a portion of the center conductor near the distal end is tapered and exposed to air while a portion of the center conductor near the proximal end is surrounded by a rigid dielectric.

29. A plasma generator, comprising:
a center conductor configured to maintain an electrical length of an integer multiple of quarter wavelengths;
an outer conductor surrounding the center conductor;
a radio frequency control component disposed along the center conductor; and
a direct current power input line connected to the radio frequency control component.

30. The plasma generator of claim 29, wherein the radio frequency control component is a folded resonator assembly comprising:
an outer conducting path; and
an inner conducting path having a shorter electrical length than the outer conducting path, wherein the inner conducting path and the outer conducting path have a difference in electrical lengths that is an integer multiple of a half wavelength.

31. The plasma generator of claim 30, further comprising:
a radio frequency power coupling means arranged in a coupling relationship to the center conductor.

32. The plasma generator of claim 31, wherein the radio frequency power coupling means substantially surrounds the center conductor.

33. A quarter wave coaxial cavity resonator assembly, comprising;
an interior center conductor portion having a first proximal end and a first distal end;
an exterior center conductor portion having a second proximal end and a second distal end;
a connecting center conductor portion connected to the interior center conductor portion and the exterior center conductor portion;
wherein an inner conducting path has an electrical length that is an integer multiple of a quarter wavelength, and is defined from the first proximal end directly to the first distal end;
wherein an outer conducting path has an electrical length longer than the electrical length of the inner conducting path by an integer multiple of a half wavelengths, and is defined from the first proximal end to the connecting center conductor portion to the second proximal end to the second distal end to the connecting center conductor portion to the first distal end; and
a direct current power input line connected to the first proximal end.

34. The quarter wave coaxial cavity resonator assembly of claim 33, further comprising:
a radio frequency power coupling means arranged in a coupling relationship to the interior center conductor portion.

35. The quarter wave coaxial cavity resonator assembly of claim 34, further comprising:
a negative resistance device connected to the radio frequency power coupling means.

36. The quarter wave coaxial cavity resonator assembly of claim 35, wherein the negative resistance device and the direct current power input line are both connected to a single direct current power source.

37. A plasma generator, comprising:
a center conductor configured to maintain a virtual short location under the influence of a radio frequency power source;
an outer conductor arranged around the center conductor; and
a direct current power input line connected to the center conductor proximal to the virtual short location, wherein the direct current power input line is configured to receive a voltage supply of direct current power from a direct current power source.

38. The plasma generator of claim 37, further comprising:
a radio frequency control component connected between the direct current power input line and the center conductor, and configured to restrict the passage of a voltage supply of radio frequency power to the direct current power source.

39. The plasma generator of claim 38, wherein the radio frequency control component is an additional resonator assembly configured to shift the voltage supply of radio frequency power 180 degrees out of phase relative to a ground plane of the plasma generator.

40. The plasma generator of claim 37, wherein the plasma generator comprises a plurality of quarter wave coaxial cavity resonators coupled in a series arrangement, the resonators including center conductors coupled to the radio frequency power source.

41. A vehicle comprising:
a chassis;
a drivetrain;
a set of wheels;
a fuel source configured to house a combustible fuel;
an oxygen inlet configured to guide a supply of oxygen;
a combustion chamber configured to receive the combustible fuel and the supply of oxygen;
a radio frequency power source;
a direct current power source;
a plasma generator at least partially exposed to the combustion chamber, comprising:
  a coaxial cavity resonator assembly including a center conductor that is oriented in a coupling arrangement to a radio frequency coupling means that is connected to the radio frequency power source, wherein the coaxial cavity resonator assembly is configured such that the center conductor is configured to maintain a virtual short location; and
  a direct current power input line that is connected to the direct current power source, wherein the direct current power input line is connected to the center conductor proximal to the virtual short location.

42. A vehicle comprising:
a chassis;
a directional fin;
a steering apparatus;
a fuel source capable of housing a combustible fuel;
an oxygen inlet capable of guiding a supply of oxygen;
a combustion environment configured to receive the combustible fuel and the supply of oxygen;
a radio frequency power source;
a direct current power source;
a plasma generator at least partially exposed to the combustion environment, comprising:
  a coaxial cavity resonator assembly including a center conductor that is oriented in a coupling arrangement to a radio frequency coupling means that is connected to the radio frequency power source, wherein the coaxial cavity resonator assembly is configured such that the center conductor is configured to maintain a virtual short location; and
  a direct current power input line that is connected to the direct current power source, wherein the direct current power input line is connected to the center conductor proximal to the virtual short location.

43. An engine comprising:
a fuel inlet;
an oxygen inlet;
a combustion environment exposed to the fuel inlet and the oxygen inlet;
a plasma generator at least partially exposed to the combustion environment, comprising:
  a coaxial cavity resonator assembly including a center conductor that is oriented in a coupling arrangement to a radio frequency coupling means that is connected to a radio frequency power source, wherein the coaxial cavity resonator assembly is configured such that the center conductor is configured to maintain a virtual short location; and
a direct current power input line that is connected to a direct current power source, wherein the direct current power input line is connected to the center conductor proximal to the virtual short location.

44. An ignition system comprising:
an electronic ignition controller capable of providing a radio frequency power output and a direct current power output;
a plasma generator comprising:
  a coaxial cavity resonator assembly including a center conductor that is oriented in a coupling arrangement to a radio frequency coupling means that is connected to the radio frequency power output, wherein the coaxial cavity resonator assembly is configured such that the center conductor is configured to maintain a virtual short location; and
  a direct current power input line that is connected to the direct current power output, wherein the direct current power input line is connected to the center conductor proximal to the virtual short location.

45. A method of generating a plasma in a coaxial cavity resonator assembly by providing a combined amount of voltage from radio frequency power and direct current power, comprising:
providing a first portion of voltage to the coaxial cavity resonator assembly from radio frequency power that alone is not sufficient to initiate a plasma at a distal end of the coaxial cavity resonator assembly, wherein the provision of the first portion of voltage defines a first ratio of power over voltage;
providing a second portion of voltage to the coaxial cavity resonator assembly from direct current power that alone is not sufficient to initiate a plasma at the distal end of the coaxial cavity resonator assembly, wherein the provision of the second portion of voltage defines a second ratio of power over voltage; and
generating a plasma at the distal end of the coaxial cavity resonator assembly by providing the combined amount of voltage from the first portion of voltage and the second portion of voltage, wherein the second ratio is less than the first ratio.

46. A method of generating a plasma in a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the resonator assembly;

providing a second portion of voltage to the coaxial cavity resonator assembly from direct current power that alone is not sufficient to initiate a plasma at the distal end of the coaxial cavity resonator assembly, wherein the direct current power provides more than 51 percent of the combined amount of voltage sufficient to initiate a plasma at the distal end of the coaxial cavity resonator assembly; and generating a plasma at the distal end of the coaxial cavity resonator assembly through the provision of the combined amount of voltage from the first portion of voltage and the second portion of voltage.

47. A method of generating a plasma in an ignition system with a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the coaxial cavity resonator assembly, wherein the provision of the first portion of voltage defines a first ratio of power over voltage;

providing a second portion of voltage to the coaxial cavity resonator assembly from direct current power that alone is not sufficient to initiate a plasma at the distal end of the coaxial cavity resonator assembly, wherein the provision of the second portion of voltage defines a second ratio of power over voltage; and generating a plasma at the distal end of the coaxial cavity resonator assembly by providing the combined amount of voltage from the first portion of voltage and the second portion of voltage, wherein the second ratio is less than the first ratio.

48. A method of generating a plasma an ignition system with a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the resonator assembly;

providing a second portion of voltage to the coaxial cavity resonator assembly from direct current power that alone is not sufficient to initiate a plasma at the distal end of the coaxial cavity resonator assembly, wherein the direct current power provides more than 51 percent of the combined amount of voltage sufficient to initiate a plasma at the distal end of the coaxial cavity resonator assembly; and generating a plasma at the distal end of the coaxial cavity resonator assembly through the provision of the combined amount of voltage from the first portion of voltage and the second portion of voltage.

49. A method of generating a plasma in an engine with a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the coaxial cavity resonator assembly, wherein the provision of the first portion of voltage defines a first ratio of power over voltage;

providing a second portion of voltage to the coaxial cavity resonator assembly from direct current power that alone is not sufficient to initiate a plasma at the distal end of the coaxial cavity resonator assembly, wherein the provision of the second portion of voltage defines a second ratio of power over voltage; and generating a plasma at the distal end of the coaxial cavity resonator assembly by providing the combined amount of voltage from the first portion of voltage and the second portion of voltage, wherein the second ratio is less than the first ratio.

50. A method of generating a plasma in an engine with a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the resonator assembly;

providing a second portion of voltage to the coaxial cavity resonator assembly from direct current power that alone is not sufficient to initiate a plasma at the distal end of the coaxial cavity resonator assembly, wherein the direct current power provides more than 51 percent of the combined amount of voltage sufficient to initiate a plasma at the distal end of the coaxial cavity resonator assembly; and generating a plasma at the distal end of the coaxial cavity resonator assembly through the provision of the combined amount of voltage from the first portion of voltage and the second portion of voltage.

51. A method of generating a plasma in a vehicle with an engine having a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the coaxial cavity resonator assembly, wherein the provision of the first portion of voltage defines a first ratio of power over voltage;

providing a second portion of voltage to the coaxial cavity resonator assembly from direct current power that alone is not sufficient to initiate a plasma at the distal end of the coaxial cavity resonator assembly, wherein the provision of the second portion of voltage defines a second ratio of power over voltage; and generating a plasma at the distal end of the coaxial cavity resonator assembly by providing the combined amount of voltage from the first portion of voltage and the second portion of voltage, wherein the second ratio is less than the first ratio.

52. A method of generating a plasma in a vehicle with an engine having a coaxial cavity resonator assembly by providing a combined amount of voltage from radio frequency power and direct current power, comprising:

providing a first portion of voltage to the coaxial cavity resonator assembly from radio frequency power that alone is not sufficient to initiate a plasma at a distal end of the resonator assembly;

providing a second portion of voltage to the coaxial cavity resonator assembly from direct current power that alone is not sufficient to initiate a plasma at the distal end of the coaxial cavity resonator assembly, wherein the direct current power provides more than 51 percent of the combined amount of voltage sufficient to initiate a plasma at the distal end of the coaxial cavity resonator assembly; and generating a plasma at the distal end of the coaxial cavity resonator assembly through the provision of the combined amount of voltage from the first portion of voltage and the second portion of voltage.

53. A plasma generator comprising:

a source of radio frequency power;

a source of direct current power; and means for initiating a plasma from a combination voltage provided by the source of direct current power and provided by the source of radio frequency power.

54. The plasma generator of claim 53 further comprising:

means for isolating the source of radio frequency power from the source of direct current power.

55. A plasma generator comprising:

means for providing a voltage supply of radio frequency power;

means for providing a voltage supply of direct current power; and a coaxial cavity resonator assembly including a center conductor that both is oriented in a coupling arrangement to the voltage supply of radio frequency power and is configured to maintain a virtual short location for connection to the voltage supply of direct current power.

* * * * *